United States Patent
Tang et al.

(10) Patent No.: US 10,885,979 B2
(45) Date of Patent: Jan. 5, 2021

(54) PAIRED INTERCALATION CELLS FOR DRIFT MIGRATION

(71) Applicant: INTERNATIONAL BUSINESS MACHINES CORPORATION, Armonk, NY (US)

(72) Inventors: Jianshi Tang, Elmsford, NY (US); Praneet Adusumilli, Somerset, NJ (US); Reinaldo Vega, Mahopac, NY (US); Takashi Ando, Tuckahoe, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/379,250

(22) Filed: Apr. 9, 2019

(65) Prior Publication Data

US 2020/0327941 A1    Oct. 15, 2020

(51) Int. Cl.
| | |
|---|---|
| *G11C 11/00* | (2006.01) |
| *G11C 13/02* | (2006.01) |
| *G11C 11/56* | (2006.01) |
| *G11C 13/00* | (2006.01) |

(52) U.S. Cl.
CPC .......... *G11C 13/02* (2013.01); *G11C 11/5678* (2013.01); *G11C 13/0004* (2013.01); *G11C 13/0009* (2013.01)

(58) Field of Classification Search
CPC . G11C 13/02; G11C 11/5678; G11C 13/0004; G11C 13/0009
See application file for complete search history.

(56) References Cited

U.S. PATENT DOCUMENTS

| | | | |
|---|---|---|---|
| 6,314,014 B1 | 11/2001 | Lowrey et al. | |
| 7,074,519 B2 * | 7/2006 | Kuhr | G11C 11/5664 365/151 |
| 7,688,634 B2 | 3/2010 | Richter et al. | |
| 8,058,643 B2 * | 11/2011 | Meyer | G11C 13/02 257/27 |
| 8,064,248 B2 | 11/2011 | Lung | |

(Continued)

FOREIGN PATENT DOCUMENTS

EP    1892723 A1    2/2008

OTHER PUBLICATIONS

Bichler et al., "Visual Pattern Extraction Using Energy-Efficient "2-PCM Synapse" Neuromorphic Architecture", IEEE Transactions on Electron Devices. vol. 59. No. 8. Aug. 2012. (pp. 2206-2213.).

(Continued)

*Primary Examiner* — Pho M Luu
(74) *Attorney, Agent, or Firm* — Tutunjian & Bitetto, P.C.; Randall Bluestone

(57) ABSTRACT

A method is presented for mitigating conductance drift in intercalation cells for neuromorphic computing. The method includes forming a first electro-chemical random access memory (ECRAM) structure over a substrate and forming a second ECRAM over the substrate, the first and second ECRAMs sharing a common contact. The common contact can be either a source contact or a drain contact. Each of the first and second ECRAMs can include a tungsten oxide layer, an electrolyte layer, and a gate contact.

20 Claims, 7 Drawing Sheets

(56) References Cited

U.S. PATENT DOCUMENTS

| 8,218,351 B2* | 7/2012 | Bloch .................... G11C 13/02 |
| | | 365/106 |
| 9,007,808 B1 | 4/2015 | Dinh et al. |
| 9,053,785 B2 | 6/2015 | Krebs et al. |
| 9,627,441 B2 | 4/2017 | Van Buskirk |
| 2019/0272874 A1* | 9/2019 | Dananjaya .......... H01L 45/1233 |

OTHER PUBLICATIONS

Tang et al., "ECRAM as Scalable Synaptic Cell for High-Speed, Low-Power Neuromorphic Computing", 2018 IEEE International Electron Devices Meeting (IEDM) Dec. 1, 2018. (pp. 1-4.).

* cited by examiner

PAIRED INTERCALATION CELLS FOR DRIFT MIGRATION

BACKGROUND

The present invention relates generally to semiconductor devices, and more specifically, to paired intercalation cells for drift migration.

An artificial neural network (ANN) is an information processing system that is inspired by biological nervous systems, such as the brain. The key element of ANNs is the structure of the information processing system, which includes a large number of highly interconnected processing elements (called "neurons") working in parallel to solve specific problems. ANNs are furthermore trained in-use, with learning that involves adjustments to weights that exist between the neurons. An ANN is configured for a specific application, such as pattern recognition or data classification, through such a learning process.

SUMMARY

In accordance with an embodiment, a method is provided for mitigating conductance drift in intercalation cells for neuromorphic computing. The method includes forming a first electro-chemical random access memory (ECRAM) structure over a substrate and forming a second ECRAM over the substrate, the first and second ECRAMs sharing a common contact.

In accordance with another embodiment, a structure for mitigating conductance drift in intercalation cells for neuromorphic computing is provided. The structure includes a first electro-chemical random access memory (ECRAM) structure disposed over a substrate and a second ECRAM disposed over the substrate, the first and second ECRAMs sharing a common contact.

In accordance with yet another embodiment, a structure for mitigating conductance drift in intercalation cells for neuromorphic computing is provided. The structure includes a first electro-chemical random access memory (ECRAM) structure disposed over a substrate and a second ECRAM vertically stacked with the first ECRAM, the first and second ECRAMs separated by a spacer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
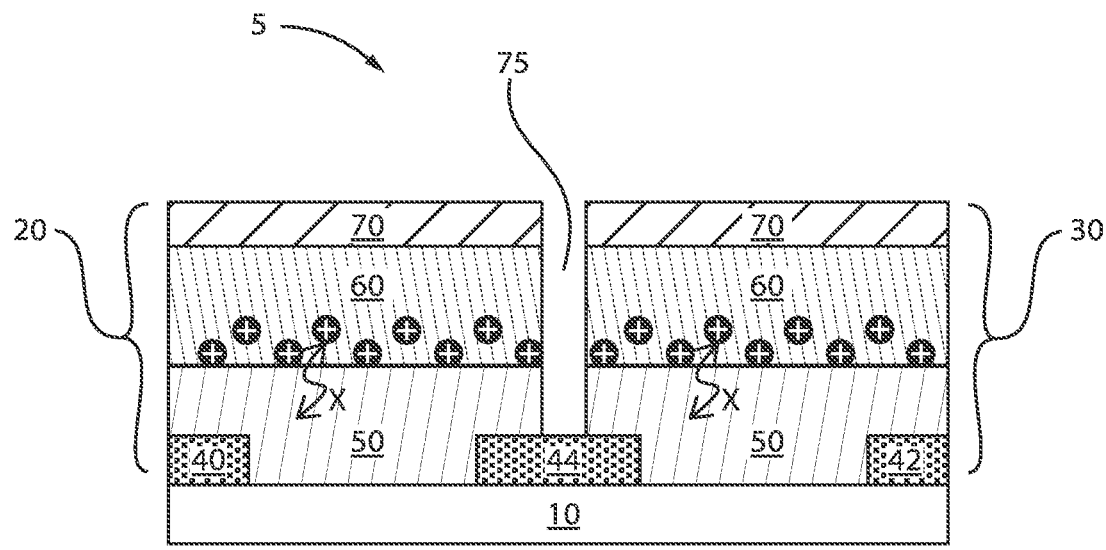
FIG. 1 is a cross-sectional view of two electro-chemical random access memories (ECRAMs) connected by wiring and having a common drain contact, in accordance with an embodiment of the present invention.

Embodiments in accordance with the present invention provide for a nonvolatile Electro-Chemical Random-Access Memory (ECRAM) based on lithium (Li) or oxygen (O) ion intercalation in tungsten oxide ($WO_3$) as an artificial synapse for neuromorphic computing.

The success of deep learning is related to the availability of large data sets and the use of graphics processing units (GPUs) to implement the training with the back-propagation algorithm. While different solutions are pursued to increase computing efficiency, the von Neumann bottleneck can eventually prevent further progress. Neuromorphic computing has emerged as a new computing paradigm to enable massively parallel analog computing for deep learning. For example, a new architecture of resistive processing unit (RPU) could provide 30,000× acceleration compared to state-of-the-art CPU/GPU in training deep neural networks. Experimentally, various nonvolatile memories (NVMs), such as resistive random-access memory (ReRAM) and phase-change memory (PCM), have been evaluated as synaptic elements to build prototype neural networks. While such NVMs have recently shown encouraging results for inference, their success in training neural network is hampered by their non-ideal switching characteristics, such as asymmetric weight update, stochasticity, and limited endurance. To circumvent those intrinsic flaws of NVMs, nonvolatile electrochemical switches (e.g., ECRAMs) are proposed as artificial synapses for neuromorphic computing. The electrochemically driven intercalation or redox reaction can be precisely and reversibly controlled by the amount of charge through the gate, so ECRAMs can provide symmetric switching with plentiful discrete states and reduced stochasticity.

The exemplary embodiments of the present invention employ ECRAMs and, in particular, employ paired ECRAM (two ECRAM per synapse) to mitigate the conductance drift. The total weight of the synapse depends on the difference between these two ECRAMs (one of them is used as "reference"), and the conductance drift in the output can be cancelled out.

Examples of semiconductor materials that can be used include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one non-limiting embodiment, Ge is used in combination with TiN. However, other combinations of materials can be readily contemplated.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of two electro-chemical random access memories (ECRAMs) connected by wiring and having a common drain contact, in accordance with an embodiment of the present invention.

In various example embodiments, in structure 5, source contacts 40, 42 and drain contact 44 are formed over a substrate 10. A first ECRAM 20 and a second ECRAM 30 are formed over the substrate 10. The first ECRAM 20 is formed over the source contact 40 and over a portion of the drain contact 44. The second ECRAM 30 is formed over the source contact 42 and over a portion of the drain contact 44. The first and second ECRAMs 20, 30 are separated by an opening 75.

The first ECRAM 20 includes an oxide layer 50, an electrolyte layer 60, and a gate contact 70. The oxide layer 50 can be, e.g., tungsten oxide ($WO_3$). The electrolyte layer 60 can be, e.g., a lithium phosphorous oxynitride (LiPON) layer.

In the structure of the ECRAM 20, ions "X", such as e.g., lithium (Li) ions, are electrochemically driven by the gate to (de)intercalate into $WO_3$ to change the ECRAMs 20 conductance for synaptic weight update. Lithium phosphorous oxynitride (LiPON) can be used as a solid state electrolyte. The amount of Li ions intercalated in $WO_3$ is precisely controlled by the gate current and this process is reversible, enabling symmetric update. In operation, series of positive (negative) current pulses are fed into the gate for potentiation (depression).

Similarly, the second ECRAM 30 includes an oxide layer 50, an electrolyte layer 60, and a gate contact 70. The oxide layer 50 can be, e.g., tungsten oxide ($WO_3$). The electrolyte layer 60 can be, e.g., a lithium phosphorous oxynitride (LiPON) layer.

Therefore, two separate ECRAMs 20, 30 are connected to each other by wiring. The two ECRAMs 20, 30 share a common drain contact 44.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

Figure 2:
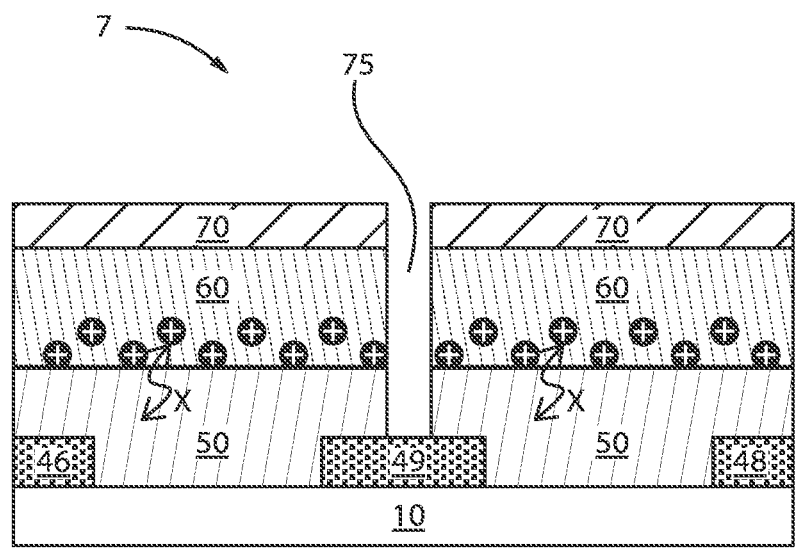
FIG. 2 is a cross-sectional view of two electro-chemical random access memories (ECRAMs) connected by wiring and having a common source contact, in accordance with an embodiment of the present invention.

FIG. 2 is a cross-sectional view of two electro-chemical random access memories (ECRAMs) connected by wiring and having a common source contact, in accordance with an embodiment of the present invention.

In another exemplary embodiment, instead of the ECRAMs 20, 30 sharing a common drain contact, the two ECRAMs 20, 30 share a common source contact 49.

In particular, in various example embodiments, in structure 7, drain contacts 46, 48 and source contact 49 are formed over a substrate 10. A first ECRAM 20 and a second ECRAM 30 are formed over the substrate 10. The first ECRAM 20 is formed over the drain contact 46 and over a portion of the source contact 49. The second ECRAM 30 is formed over the drain contact 48 and over a portion of the source contact 49. The first and second ECRAMs 20, 30 are separated by an opening 75.

The first ECRAM 20 includes an oxide layer 50, an electrolyte layer 60, and a gate contact 70. The oxide layer 50 can be, e.g., tungsten oxide ($WO_3$). The electrolyte layer 60 can be, e.g., a lithium phosphorous oxynitride (LiPON) layer.

In the structure of the ECRAM 20, ions "X", such as e.g., lithium (Li) ions, are electrochemically driven by the gate to (de)intercalate into $WO_3$ to change the ECRAMs 20 conductance for synaptic weight update.

Similarly, the second ECRAM 30 includes the oxide layer 50, the electrolyte layer 60, and a gate contact 70. The oxide layer 50 can be, e.g., tungsten oxide ($WO_3$). The electrolyte layer 60 can be, e.g., a lithium phosphorous oxynitride (LiPON) layer.

Therefore, two separate ECRAMs 20, 30 are connected to each other by wiring. The two ECRAMs 20, 30 share a common source contact 49.

Figure 3:
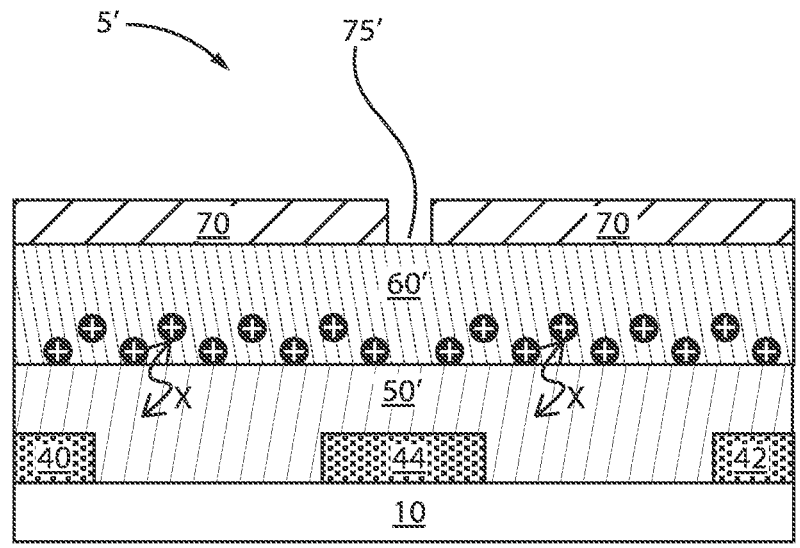
FIG. 3 is a cross-sectional view of two ECRAMs sharing oxide and electrolyte layers, and having a common drain contact, in accordance with an embodiment of the present invention.

FIG. 3 is a cross-sectional view of two ECRAMs sharing oxide and electrolyte layers, and having a common drain contact, in accordance with an embodiment of the present invention.

In various example embodiments, in structure 5', source contacts 40, 42 and drain contact 44 are formed over a substrate 10. A first ECRAM 20 and a second ECRAM 30 are formed over the substrate 10. The first ECRAM 20 is formed over the source contact 40 and over the entirety of the drain contact 44. The second ECRAM 30 is formed over the source contact 42 and over the entirety of the drain contact 44. The first and second ECRAMs 20, 30 are separated by an opening 75'. Thus, the two ECRAMs 20, 30 share both source and drain contacts.

The first ECRAM 20 includes an oxide layer 50', an electrolyte layer 60', and a gate contact 70. The oxide layer 50' can be, e.g., tungsten oxide ($WO_3$). The electrolyte layer 60' can be, e.g., a lithium phosphorous oxynitride (LiPON) layer.

In the structure of the ECRAM 20, ions "X", such as e.g., lithium (Li) ions, are electrochemically driven by the gate to (de)intercalate into $WO_3$ to change the ECRAMs 20 conductance for synaptic weight update.

Similarly, the second ECRAM 30 includes an oxide layer 50', an electrolyte layer 60', and a gate contact 70. The oxide layer 50' can be, e.g., tungsten oxide ($WO_3$). The electrolyte layer 60' can be, e.g., a lithium phosphorous oxynitride (LiPON) layer.

The ECRAMs 20, 30 share a common oxide layer 50' and an electrolyte layer 60', and have separate gate contacts 70.

Therefore, the two separate ECRAMs 20, 30 share source and drain contacts 40, 42, 44.

Figure 4:
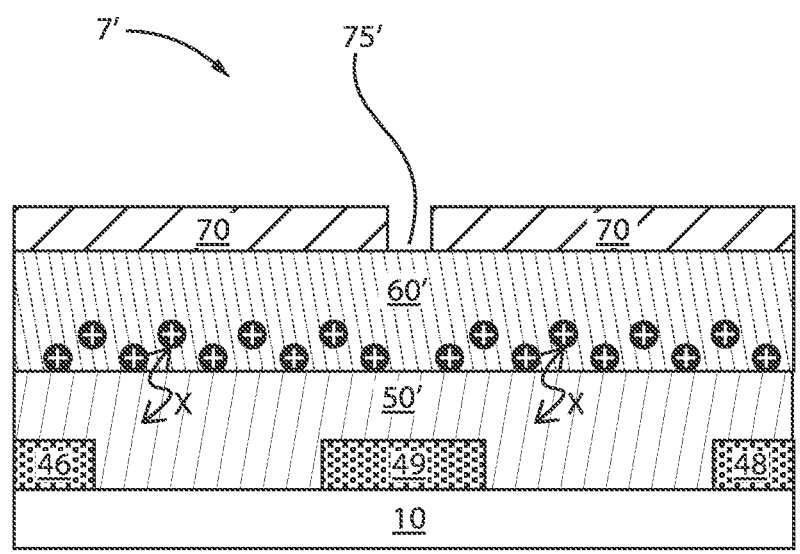
FIG. 4 is a cross-sectional view of two ECRAMs sharing oxide and electrolyte layers, and having a common source contact, in accordance with an embodiment of the present invention.

FIG. 4 is a cross-sectional view of two ECRAMs sharing oxide and electrolyte layers, and having a common source contact, in accordance with an embodiment of the present invention.

In particular, in various example embodiments, in structure 7', drain contacts 46, 48 and source contact 49 are formed over a substrate 10. A first ECRAM 20 and a second ECRAM 30 are formed over the substrate 10. The first ECRAM 20 is formed over the drain contact 46 and over the entirety of the source contact 49. The second ECRAM 30 is formed over the drain contact 48 and over an entirety of the source contact 49. The first and second ECRAMs 20, 30 are separated by an opening 75'.

The first ECRAM 20 includes an oxide layer 50', an electrolyte layer 60', and a gate contact 70. The oxide layer 50' can be, e.g., tungsten oxide ($WO_3$). The electrolyte layer 60' can be, e.g., a lithium phosphorous oxynitride (LiPON) layer.

In the structure of the ECRAM 20, ions "X", such as e.g., lithium (Li) ions, are electrochemically driven by the gate to (de)intercalate into $WO_3$ to change the ECRAMs 20 conductance for synaptic weight update.

Similarly, the second ECRAM 30 includes an oxide layer 50', an electrolyte layer 60', and a gate contact 70. The oxide layer 50' can be, e.g., tungsten oxide ($WO_3$). The electrolyte layer 60' can be, e.g., a lithium phosphorous oxynitride (LiPON) layer.

The ECRAMs 20, 30 share a common oxide layer 50' and an electrolyte layer 60', and have separate gate contacts 70.

Therefore, the two separate ECRAMs 20, 30 share source and drain contacts 46, 48, 49.

Figure 5:
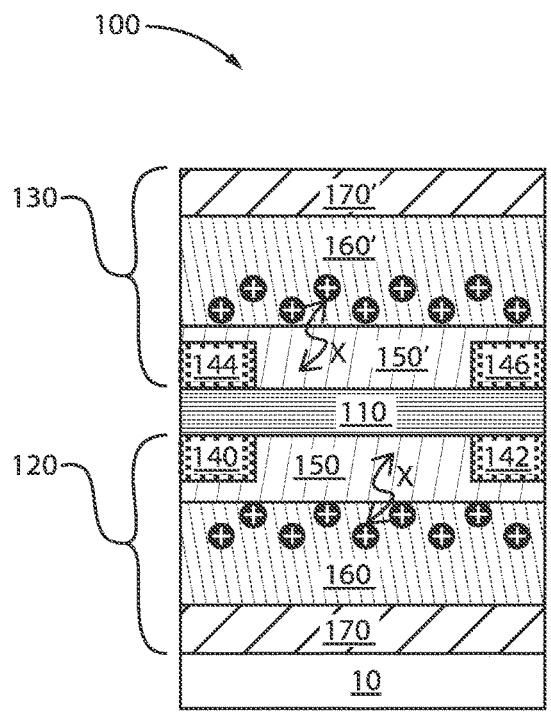
FIG. 5 is a cross-sectional view of two ECRAMs being vertically stacked together where each ECRAM has its own source and drain contacts, in accordance with an embodiment of the present invention.

FIG. 5 is a cross-sectional view of two ECRAMs being vertically stacked together where each ECRAM has its own source and drain contacts, in accordance with an embodiment of the present invention.

In various example embodiments, in structure 100, a first ECRAM 120 can be vertically stacked with a second ECRAM 130. The first and second ECRAMs 120, 130 can be vertically stacked over the substrate 10. The first ECRAM 120 is separated from the second ECRAM 130 by a spacer 110.

The first ECRAM 120 includes a source contact 140 and a drain contact 142. The first ECRAM 120 further includes an oxide layer 150, an electrolyte layer 160, and a gate contact 170. The gate contact 170 is in direct contact with the substrate 10. The oxide layer 150 can be, e.g., tungsten oxide ($WO_3$). The electrolyte layer 160 can be, e.g., a lithium phosphorous oxynitride (LiPON) layer.

In the structure of the ECRAM 120, ions "X", such as e.g., lithium (Li) ions, are electrochemically driven by the gate to (de)intercalate into $WO_3$ to change the ECRAMs 120 conductance for synaptic weight update.

Similarly, the second ECRAM 130 includes a source contact 144 and a drain contact 146. The second ECRAM 130 further includes an oxide layer 150', an electrolyte layer 160', and a gate contact 170'. The oxide layer 150' can be, e.g., tungsten oxide ($WO_3$). The electrolyte layer 160' can be, e.g., a lithium phosphorous oxynitride (LiPON) layer.

Therefore, the first ECRAM 120 includes its own source and drain contacts 140, 142 and the second ECRAM 130 includes its own source and drain contacts 144, 146. In other words, in this exemplary embodiment, the first ECRAM 120 and the second ECRAM 130 do not share common source and/or drain contacts.

Figure 6:
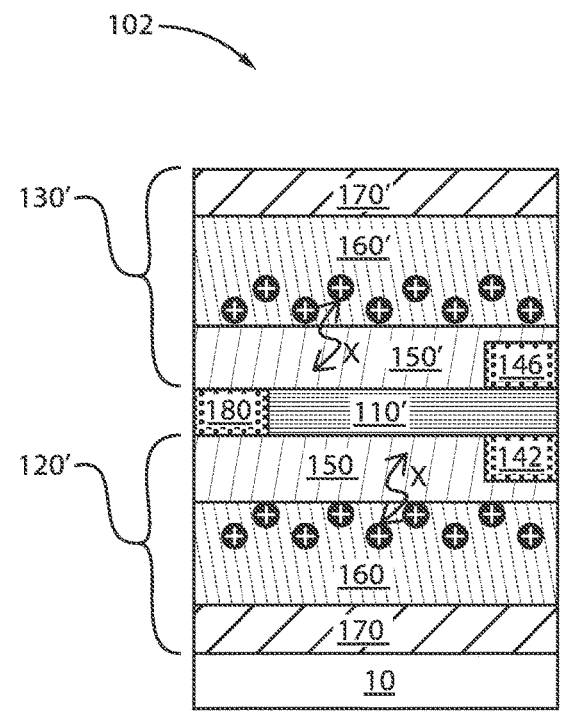
FIG. 6 is a cross-sectional view of two ECRAMs being vertically stacked together where the two ECRAMs share a common source contact, in accordance with an embodiment of the present invention.

FIG. 6 is a cross-sectional view of two ECRAMs being vertically stacked together where they share a common source contact, in accordance with an embodiment of the present invention.

In various example embodiments, in structure 102, a first ECRAM 120' can be vertically stacked with a second ECRAM 130'. The first and second ECRAMs 120', 130' can be vertically stacked over the substrate 10. The first ECRAM 120' is separated from the second ECRAM 130' by a spacer 110'.

The first ECRAM 120' includes a source contact 180 and a drain contact 142. The first ECRAM 120' further includes an oxide layer 150, an electrolyte layer 160, and a gate contact 170. The gate contact 170 is in direct contact with the substrate 10. The oxide layer 150 can be, e.g., tungsten oxide ($WO_3$). The electrolyte layer 160 can be, e.g., a lithium phosphorous oxynitride (LiPON) layer.

In the structure of the ECRAM 120', ions "X", such as e.g., lithium (Li) ions, are electrochemically driven by the gate to (de)intercalate into $WO_3$ to change the ECRAMs 120' conductance for synaptic weight update.

Similarly, the second ECRAM 130' includes the source contact 180 and a drain contact 146. The second ECRAM 130' further includes an oxide layer 150', an electrolyte layer 160', and a gate contact 170'. The oxide layer 150' can be, e.g., tungsten oxide ($WO_3$). The electrolyte layer 160' can be, e.g., a lithium phosphorous oxynitride (LiPON) layer.

Therefore, the first ECRAM 120' and the second ECRAM 130' are vertically stacked together and share a common source contact 180.

Figure 7:
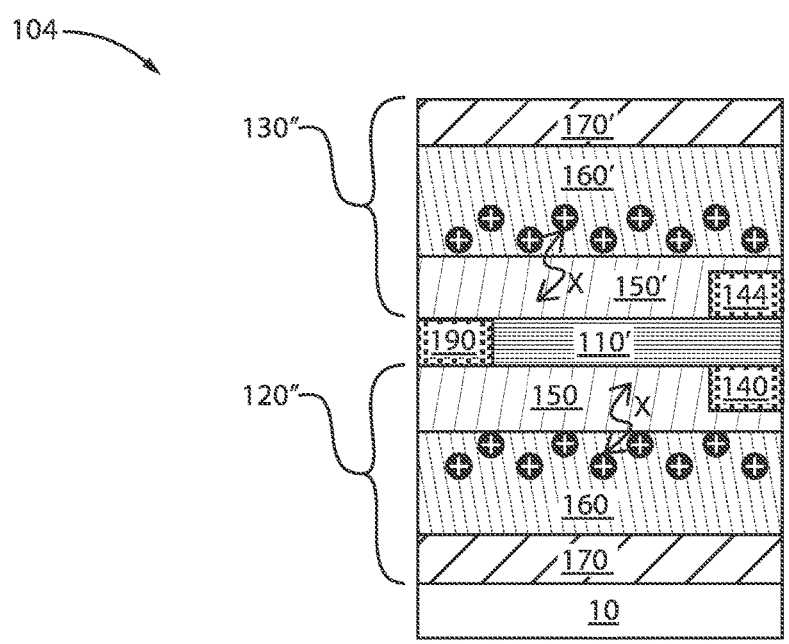
FIG. 7 is a cross-sectional view of two ECRAMs being vertically stacked together where the two ECRAMs share a common drain contact, in accordance with an embodiment of the present invention.

FIG. 7 is a cross-sectional view of two ECRAMs being vertically stacked together where they share a common drain contact, in accordance with an embodiment of the present invention.

In various example embodiments, in structure 104, a first ECRAM 120" can be vertically stacked with a second ECRAM 130". The first and second ECRAMs 120", 130" can be vertically stacked over the substrate 10. The first ECRAM 120" is separated from the second ECRAM 130" by a spacer 110'.

The first ECRAM 120" includes a drain contact 190 and a source contact 140. The first ECRAM 120" further includes an oxide layer 150, an electrolyte layer 160, and a gate contact 170. The gate contact 170 is in direct contact with the substrate 10. The oxide layer 150 can be, e.g., tungsten oxide ($WO_3$). The electrolyte layer 160 can be, e.g., a lithium phosphorous oxynitride (LiPON) layer.

In the structure of the ECRAM 120", ions "X", such as e.g., lithium (Li) ions, are electrochemically driven by the gate to (de)intercalate into $WO_3$ to change the ECRAMs 120" conductance for synaptic weight update.

Similarly, the second ECRAM 130" includes the drain contact 190 and a source contact 144. The second ECRAM 130" further includes an oxide layer 150', an electrolyte layer 160', and a gate contact 170'. The oxide layer 150' can be, e.g., tungsten oxide ($WO_3$). The electrolyte layer 160' can be, e.g., a lithium phosphorous oxynitride (LiPON) layer.

Therefore, the first ECRAM 120" and the second ECRAM 130" are vertically stacked together and share a common drain contact 190.

Figure 8:
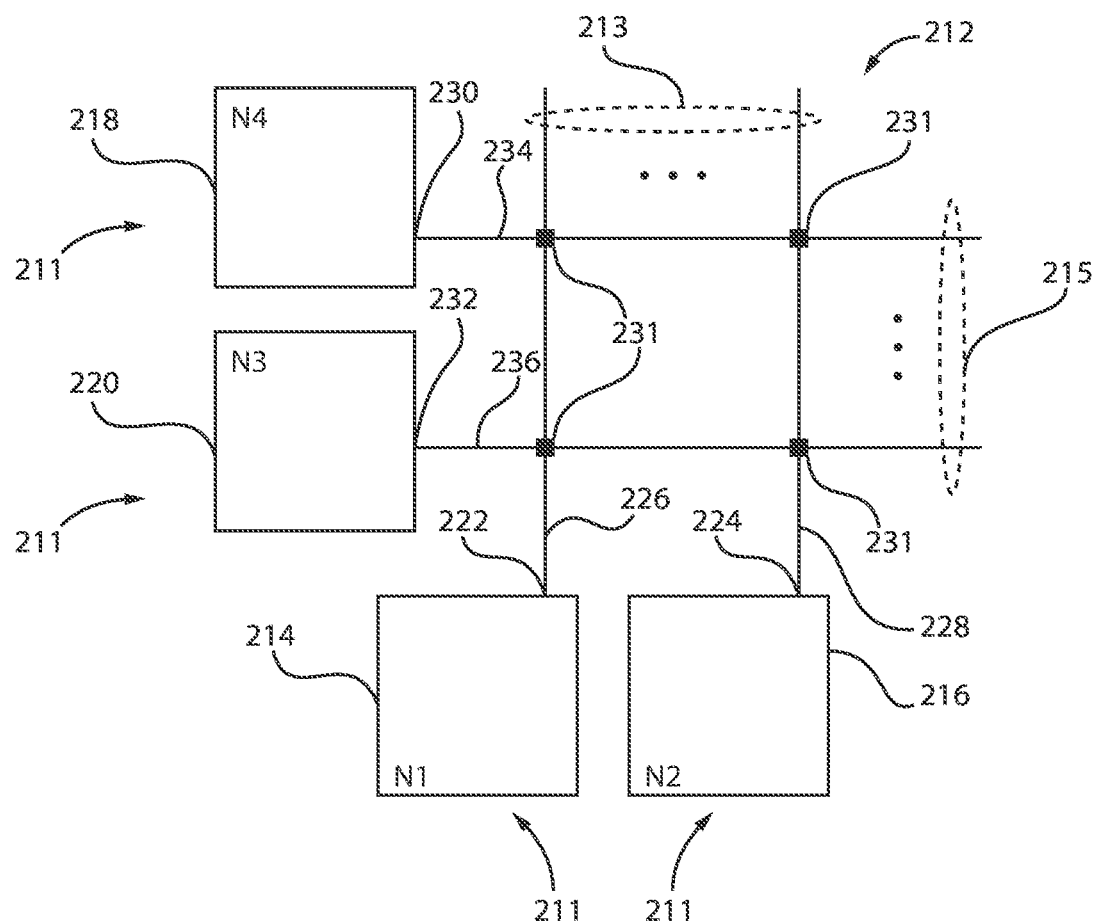
FIG. 8 is a block/flow diagram of an exemplary neuromorphic and synaptronic network including a crossbar of electronic synapses interconnecting electronic neurons and axons, in accordance with an embodiment of the present invention.

FIG. 8 is a block/flow diagram of an exemplary neuromorphic and synaptronic network including a crossbar of electronic synapses interconnecting electronic neurons and axons, in accordance with an embodiment of the present invention.

The example tile circuit 210 has a crossbar 212 in accordance with an embodiment of the invention. In one example, the overall circuit can include an "ultra-dense crossbar array" that can have a pitch in the range of about 0.1 nm to 10 μm. The neuromorphic and synaptronic circuit 210 includes the crossbar 212 interconnecting a plurality of digital neurons 211 including neurons 214, 216, 218 and 220. These neurons 211 are also referred to herein as "electronic neurons." For illustration purposes, the example circuit 210 provides symmetric connections between the two pairs of neurons (e.g., N1 and N3). However, embodiments of the invention are not only useful with such symmetric connection of neurons, but also useful with asymmetric connection of neurons (neurons N1 and N3 need not be connected with the same connection). The cross-bar in a tile accommodates the appropriate ratio of synapses to neurons, and, hence, need not be square.

In the example circuit 210, the neurons 211 are connected to the crossbar 212 via dendrite paths/wires (dendrites) 213 such as dendrites 226 and 228. Neurons 211 are also connected to the crossbar 212 via axon paths/wires (axons) 215 such as axons 234 and 236. Neurons 214 and 216 are dendritic neurons and neurons 218 and 220 are axonal neurons connected with axons 213. Specifically, neurons 214 and 216 are shown with outputs 222 and 224 connected to dendrites (e.g., bitlines) 226 and 228, respectively. Axonal neurons 218 and 220 are shown with outputs 230 and 232 connected to axons (e.g., wordlines or access lines) 234 and 236, respectively.

When any of the neurons 214, 216, 218 and 220 fire, they will send a pulse out to their axonal and to their dendritic connections. Each synapse provides contact between an axon of a neuron and a dendrite on another neuron and with respect to the synapse, the two neurons are respectively called pre-synaptic and post-synaptic.

Each connection between dendrites 226, 228 and axons 234, 236 are made through a digital synapse device 231 (synapse). The junctions where the synapse devices are located can be referred to herein as "cross-point junctions." In general, in accordance with an embodiment of the invention, neurons 214 and 216 will "fire" (transmit a pulse) in response to the inputs they receive from axonal input connections (not shown) exceeding a threshold.

Neurons 218 and 220 will "fire" (transmit a pulse) in response to the inputs they receive from external input connections (not shown), usually from other neurons, exceeding a threshold. In one embodiment, when neurons 214 and 216 fire they maintain a postsynaptic-STDP (post-STDP) variable that decays. For example, in one embodiment, the decay period can be 50 ms. The post-STDP variable is used to achieve STDP by encoding the time since the last firing of the associated neuron. Such STDP is used to control long-term potentiation or "potentiation," which in this context is defined as increasing synaptic conductance. When neurons 218, 220 fire they maintain a pre-STDP (presynaptic-STDP) variable that decays in a similar fashion as that of neurons 214 and 216.

Pre-STDP and post-STDP variables can decay according to exponential, linear, polynomial, or quadratic functions, for example. In another embodiment of the invention, the variables can increase instead of decreasing over time. In any event, this variable can be used to achieve STDP by encoding the time since the last firing of the associated neuron. STDP is used to control long-term depression or "depression," which in this context is defined as decreasing synaptic conductance. Note that the roles of pre-STDP and post-STDP variables can be reversed with pre-STDP implementing potentiation and post-STDP implementing depression.

An external two-way communication environment can supply sensory inputs and consume motor outputs. Digital neurons 211 implemented using complementary metal oxide semiconductor (CMOS) logic gates receive spike inputs and integrate them. In one embodiment, the neurons 211 include comparator circuits that generate spikes when the integrated input exceeds a threshold. In one embodiment, binary synapses are implemented using transposable 1-bit static random-access memory (SRAM) cells, wherein each neuron 211 can be an excitatory or inhibitory neuron (or both). Each learning rule on each neuron axon and dendrite are reconfigurable as described below. This assumes a transposable access to the crossbar memory array. Neurons that spike are selected one at a time sending spike events to corresponding axons, where axons could reside on the core or somewhere else in a larger system with many cores.

The term electronic neuron as used herein represents an architecture configured to simulate a biological neuron. An electronic neuron creates connections between processing elements that are roughly functionally equivalent to neurons of a biological brain. As such, a neuromorphic and synaptronic system including electronic neurons according to embodiments of the invention can include various electronic circuits that are modeled on biological neurons. Further, a neuromorphic and synaptronic system including electronic neurons according to embodiments of the invention can include various processing elements (including computer simulations) that are modeled on biological neurons. Although certain illustrative embodiments of the invention are described herein using electronic neurons including electronic circuits, the present invention is not limited to electronic circuits. A neuromorphic and synaptronic system according to embodiments of the invention can be implemented as a neuromorphic and synaptronic architecture including circuitry, and additionally as a computer simulation. Indeed, embodiments of the invention can take the form of an entirely hardware embodiment, an entirely software embodiment, or an embodiment including both hardware and software elements.

Figure 9:
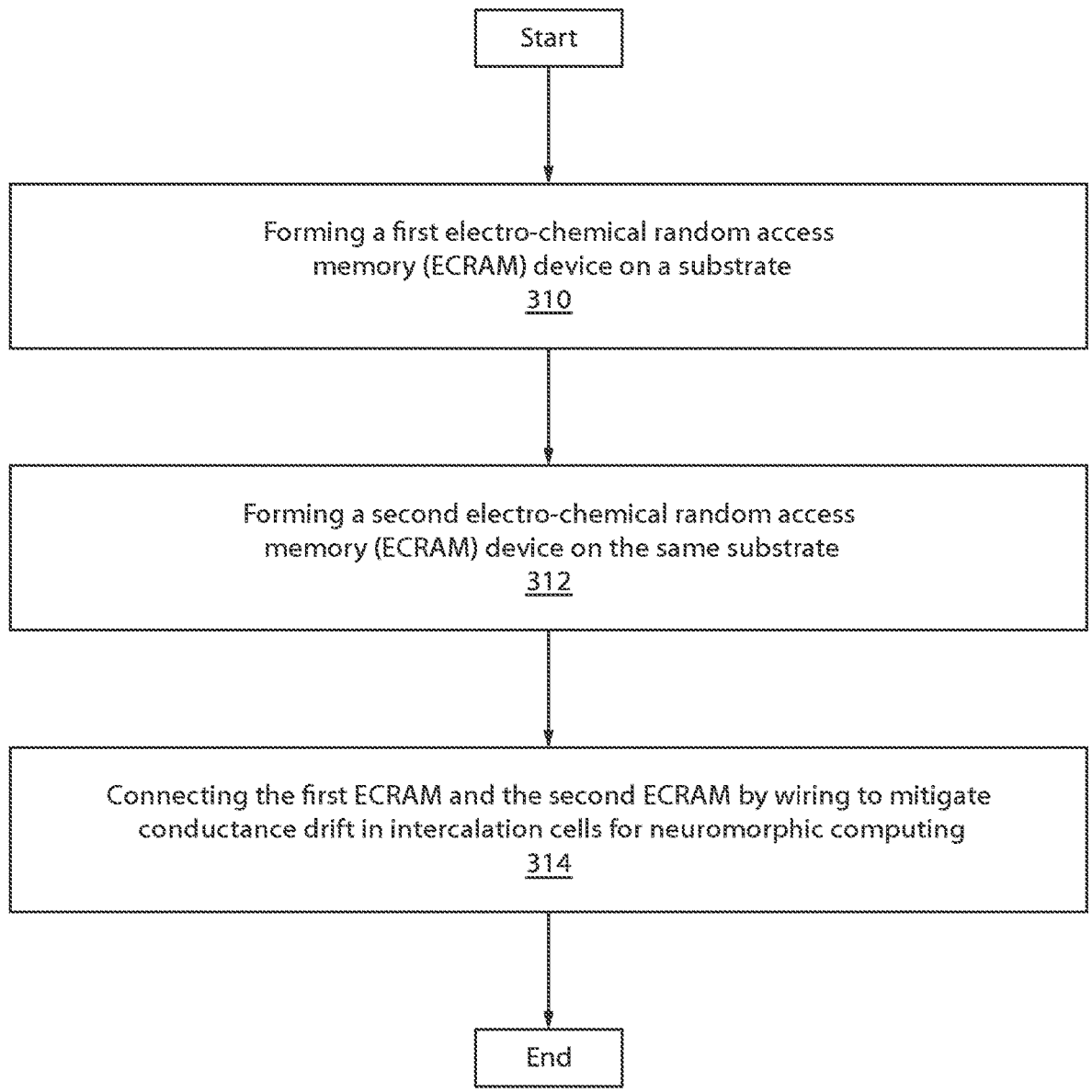
FIG. 9 is a block/flow diagram of an exemplary method for forming ECRAMs connected by wiring, in accordance with an embodiment of the present invention.

FIG. 9 is a block/flow diagram of an exemplary method for forming ECRAMs connected by wiring, in accordance with an embodiment of the present invention.

At block 310, a first electro-chemical random access memory (ECRAM) device is formed on a substrate.

At block 312, a second electro-chemical random access memory (ECRAM) device is formed on the same substrate.

At block 314, the first ECRAM and the second ECRAM are connected by wiring to mitigate conductance drift in intercalation cells for neuromorphic computing.

Figure 10:
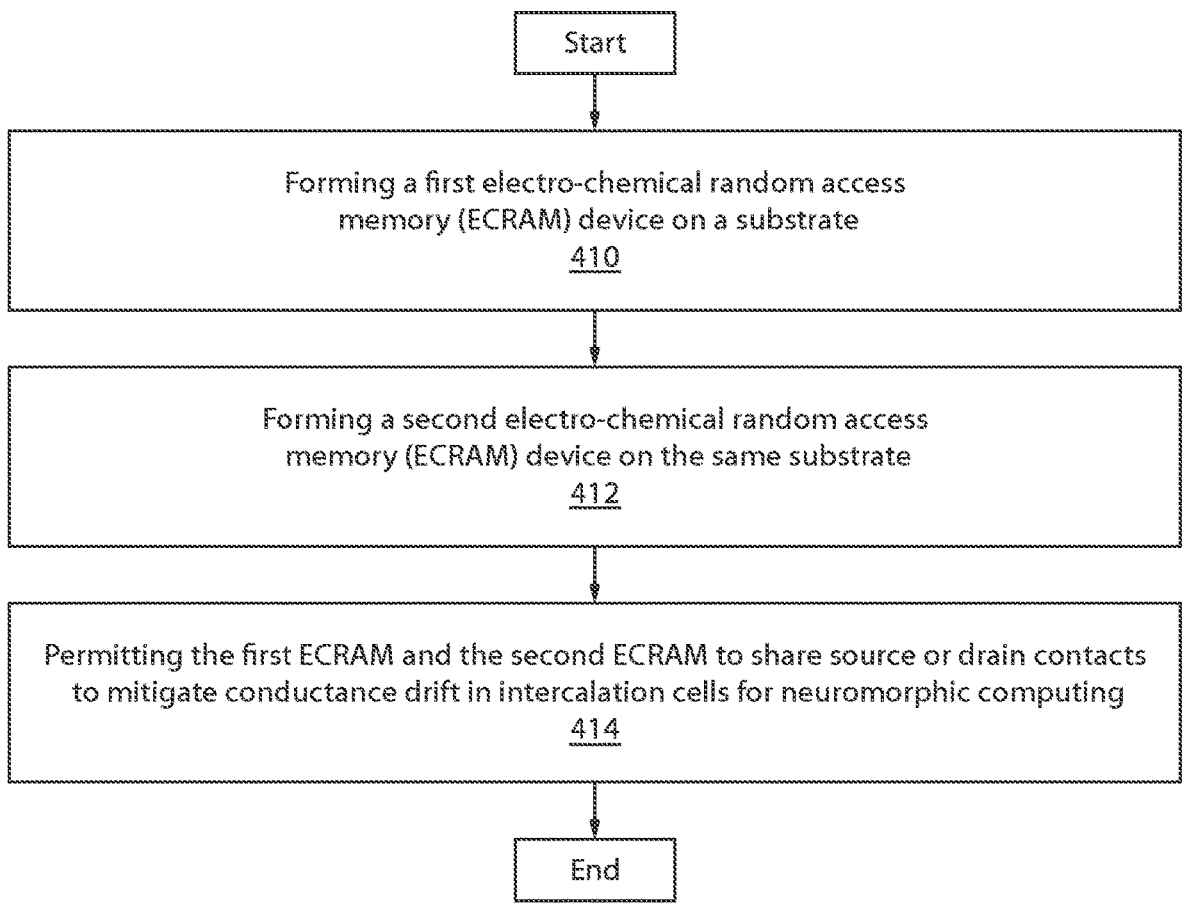
FIG. 10 is a block/flow diagram of an exemplary method for forming two ECRAMs sharing source or drain contacts, in accordance with an embodiment of the present invention.

FIG. 10 is a block/flow diagram of an exemplary method for forming two ECRAMs sharing source or drain contacts, in accordance with an embodiment of the present invention.

At block 410, a first electro-chemical random access memory (ECRAM) device is formed on a substrate.

At block 412, a second electro-chemical random access memory (ECRAM) device is formed on the same substrate.

At block 414, the first ECRAM and the second ECRAM are permitted to share source or drain contacts to mitigate conductance drift in intercalation cells for neuromorphic computing.

Figure 11:
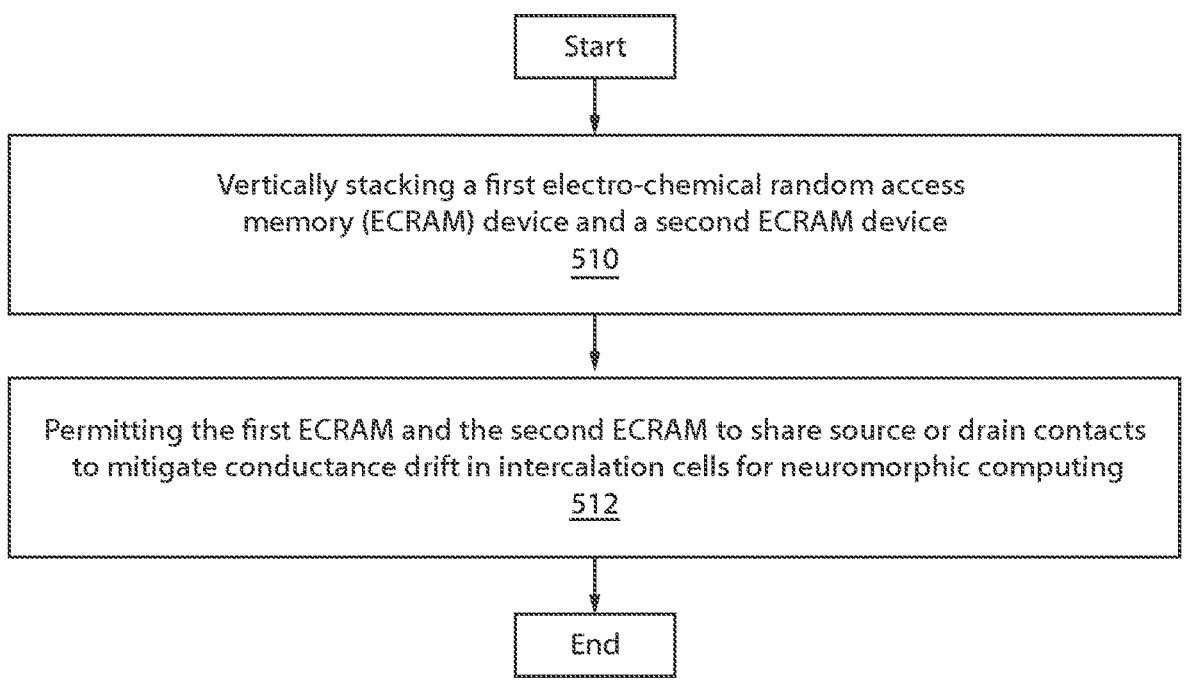
FIG. 11 is a block/flow diagram of an exemplary method for forming two ECRAMs vertically stacked together, in accordance with an embodiment of the present invention.

FIG. 11 is a block/flow diagram of an exemplary method for forming two ECRAMs vertically stacked together, in accordance with an embodiment of the present invention.

At block 510, a first electro-chemical random access memory (ECRAM) device and a second ECRAM device are vertically stacked.

At block 512, the first ECRAM and the second ECRAM are permitted to share source or drain contacts to mitigate conductance drift in intercalation cells for neuromorphic computing.

Figure 12:
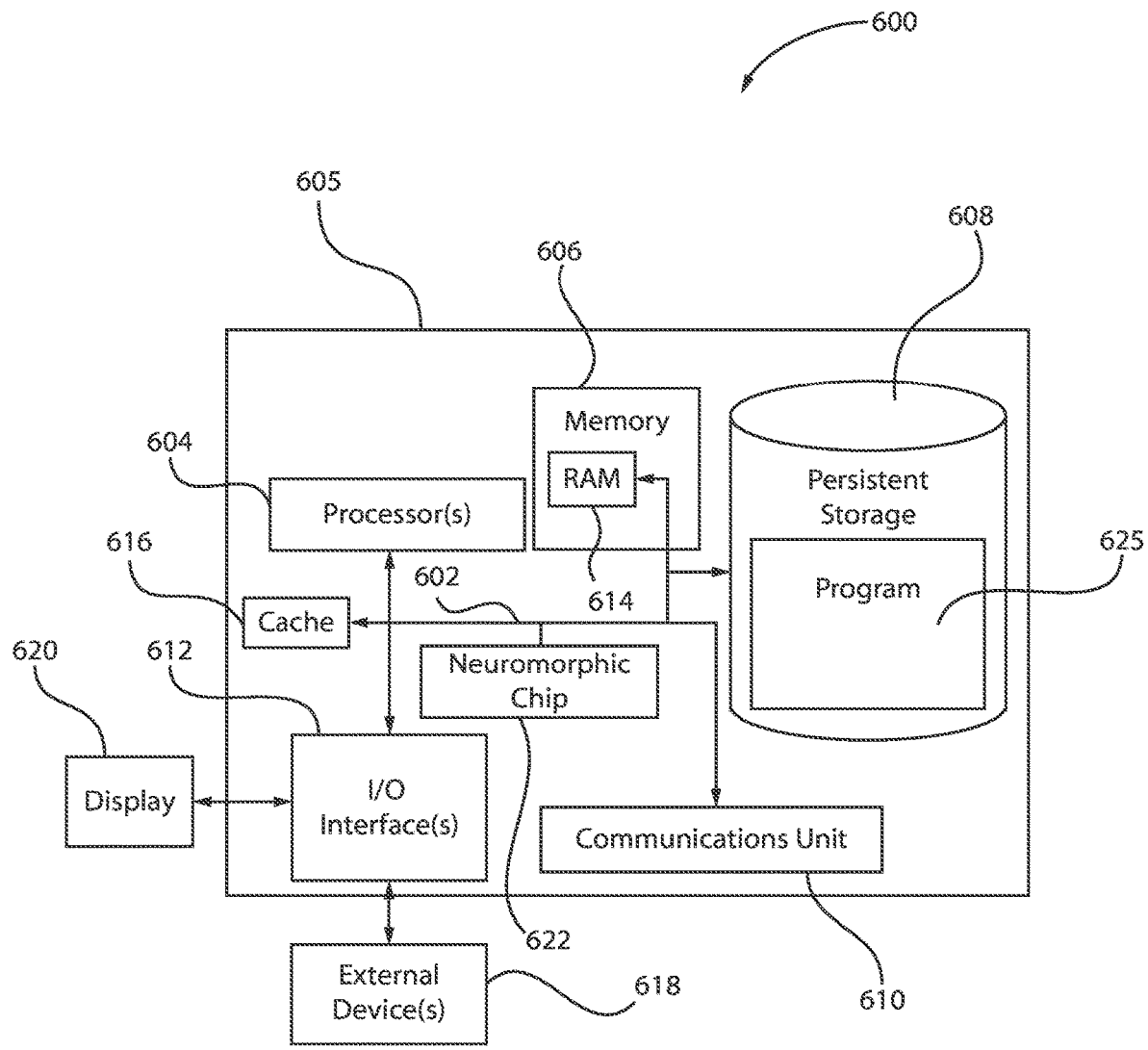
FIG. 12 depicts a block diagram of components of a computing system including a computing device and a neuromorphic chip capable of operationally performing deep learning sampling, in accordance with an embodiment of the present invention.

FIG. 12 depicts a block diagram of components of a computing system including a computing device and a neuromorphic chip capable of operationally performing deep learning sampling, in accordance with an embodiment of the present invention.

FIG. 12 depicts a block diagram of components of system 600, which includes computing device 605. It should be appreciated that FIG. 12 provides only an illustration of one implementation and does not imply any limitations with regard to the environments in which different embodiments can be implemented. Many modifications to the depicted environment can be made.

Computing device 605 includes communications fabric 602, which provides communications between computer processor(s) 604, memory 606, persistent storage 608, communications unit 610, and input/output (I/O) interface(s) 612. Communications fabric 602 can be implemented with any architecture designed for passing data and/or control information between processors (such as microprocessors, communications and network processors, etc.), system memory, peripheral devices, and any other hardware components within a system. For example, communications fabric 602 can be implemented with one or more buses.

Memory 606, cache memory 616, and persistent storage 608 are computer readable storage media. In this embodiment, memory 606 includes random access memory (RAM) 614. In general, memory 606 can include any suitable volatile or non-volatile computer readable storage media.

In some embodiments of the present invention, deep learning program 625 is included and operated by neuromorphic chip 622 as a component of computing device 605. In other embodiments, deep learning program 625 is stored in persistent storage 608 for execution by neuromorphic chip 622 in conjunction with one or more of the respective computer processors 604 via one or more memories of memory 606. In this embodiment, persistent storage 608 includes a magnetic hard disk drive. Alternatively, or in addition to a magnetic hard disk drive, persistent storage 608 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 608 can also be removable. For example, a removable hard drive can be used for persistent storage 608. Other examples include optical and magnetic disks, thumb drives, and smart cards that are inserted into a drive for transfer onto another computer readable storage medium that is also part of persistent storage 608.

In some embodiments of the present invention, neuromorphic chip 622 is included in computing device 605 and connected to communications fabric 602. Neuromorphic chip 622 includes electronic logic to provide stacked restricted Boltzmann machines, and a feed forward neural network, including deep learning algorithmic components that are trainable and perform machine learning. In other embodiments, the logistical and algorithmic components operations are performed by specialized data structures, included within computing device 605, which perform the deep learning functions of the stacked restricted Boltzmann machines, and feed forward neural network.

Communications unit 610, in these examples, provides for communications with other data processing systems or devices, including resources of distributed data processing environment. In these examples, communications unit 610 includes one or more network interface cards. Communications unit 610 can provide communications through the use of either or both physical and wireless communications links. Deep learning program 625 can be downloaded to persistent storage 608 through communications unit 610.

I/O interface(s) 612 allows for input and output of data with other devices that can be connected to computing system 600. For example, I/O interface 612 can provide a connection to external devices 618 such as a keyboard, keypad, a touch screen, and/or some other suitable input device. External devices 618 can also include portable computer readable storage media such as, for example, thumb drives, portable optical or magnetic disks, and memory cards.

Display 620 provides a mechanism to display data to a user and can be, for example, a computer monitor.

Therefore, various non-volatile memory technologies such as RRAM and PCM are being investigated for use as synaptic cells for neuromorphic computing, but they tend to have non-ideal switching characteristics (e.g., asymmetric weight update, limited endurance, and elevated levels of stochasticity, or random behavior). Instead, the exemplary embodiments describe a novel scalable electrochemical random access memory (ECRAM) device based on lithium (Li) ion intercalation in tungsten oxide ($WO_3$) that can be used as a scalable synaptic cell. These non-volatile ECRAMs showed high levels of switching symmetry and linearity, good data retention, and up to 1,000 discrete conductance levels useful for multi-level operation in large memory arrays. In particular, the exemplary embodiments focused on paired ECRAM (two ECRAM per synapse) to mitigate the conductance drift issue. Here the total weight of the synapse depends on the difference between these two ECRAMs (one of them is used as "reference"), and the conductance drift in the output can be cancelled out. Moreover, the differential weight approach can also be used during simultaneous programming of gates $G^+$ and $G^-$. In one embodiment of the ECRAM-based cross-point array, the "reference" ECRAM ($G^-$) can be shared across one bit line to save the total area.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above"

the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and device for mitigating conductance drift in intercalation cells for neuromorphic computing (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for mitigating conductance drift in intercalation cells for neuromorphic computing, the method comprising:
    forming a first electro-chemical random access memory (ECRAM) structure over a substrate; and
    forming a second ECRAM over the substrate, the first and second ECRAMs sharing a common contact disposed within one or more tungsten oxide layers.

2. The method of claim 1, wherein the common contact is a drain contact.

3. The method of claim 1, wherein the common contact is a source contact.

4. The method of claim 1, wherein each of the first and second ECRAMs includes a tungsten oxide layer of the one or more tungsten oxide layers, an electrolyte layer, and a gate contact.

5. The method of claim 4, wherein the electrolyte layer is a lithium phosphorous oxynitride (LiPON) layer.

6. The method of claim 1, wherein the first and second ECRAMs are vertically stacked together.

7. The method of claim 1, wherein a total weight of a synapse depends on a difference between the first and second ECRAMs.

8. A structure for mitigating conductance drift in intercalation cells for neuromorphic computing, the structure comprising:
    a first electro-chemical random access memory (ECRAM) structure disposed over a substrate; and
    a second ECRAM disposed over the substrate, the first and second ECRAMs sharing a common contact disposed within one or more tungsten oxide layers.

9. The structure of claim 8, wherein the common contact is a drain contact.

10. The structure of claim 8, wherein the common contact is a source contact.

11. The structure of claim 8, wherein the first and second ECRAMs are connected by wiring.

12. The structure of claim 8, wherein each of the first and second ECRAMs includes a tungsten oxide layer of the one or more tungsten oxide layers, an electrolyte layer, and a gate contact.

13. The structure of claim 12, wherein the electrolyte layer is a lithium phosphorous oxynitride (LiPON) layer.

14. The structure of claim 8, wherein a total weight of a synapse depends on a difference between the first and second ECRAMs.

15. A structure for mitigating conductance drift in intercalation cells for neuromorphic computing, the structure comprising:
    a first electro-chemical random access memory (ECRAM) structure disposed over a substrate; and
    a second ECRAM vertically stacked with the first ECRAM, the first and second ECRAMs separated by a spacer directly contacting one or more tungsten oxide layers.

16. The structure of claim 15, wherein the first ECRAM includes a first set of source and drain contacts and the second ECRAM includes a second set of source and drain contacts.

17. The structure of claim 15, wherein the first and second ECRAMs share a common drain contact.

18. The structure of claim 15, wherein the first and second ECRAMs share a common source contact.

19. The structure of claim 15, wherein each of the first and second ECRAMs includes a tungsten oxide layer of the one or more tungsten oxide layers, an electrolyte layer, and a gate contact.

20. The structure of claim 15, wherein a total weight of a synapse depends on a difference between the first and second ECRAMs.

* * * * *